Nov. 29, 1966 H. M. ZYDNEY 3,289,007
SIGNAL RECTIFIER UTILIZING OPPOSITE CONDUCTIVITY TRANSISTORS
Filed Dec. 28, 1962
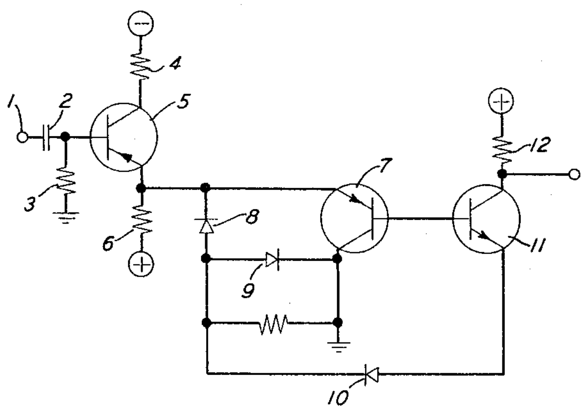
INVENTOR
H. M. ZYDNEY
BY
R C Lipton
ATTORNEY

United States Patent Office 3,289,007
Patented Nov. 29, 1966

3,289,007

SIGNAL RECTIFIER UTILIZING OPPOSITE CONDUCTIVITY TRANSISTORS

Herbert M. Zydney, New York, N.Y., assignor to Bell Telephone Laboratories, Incorporated, New York, N.Y., a corporation of New York Filed Dec. 28, 1962, Ser. No. 248,145
7 Claims. (Cl. 307—88.5)

This invention relates to a rectifier circuit and, more particularly, to a transistorized full wave signal rectifier circuit.

A broad object of this invention is to provide an improved transistor rectifier circuit.

Rectifier circuits for converting alternate current signal pulses to direct current pulses are well known in the art. In preferred arrangements these circuits use transistors as the active elements. Transistorized rectifier circuits, however, are relatively complex and require additional voltage biasing sources for the transistor electrodes.

Accordingly, an object of this invention is to reduce the component parts used in a transistor rectifier circuit.

Another object of this invention is to eliminate the additional voltage biasing sources.

In accordance with an illustrative embodiment of the present invention, the rectifier circuit utilizes the bidirectional capability of a transistor. Input signals are applied in parallel across the emitter-to-collector path of the transistor and across a pair of reversely poled diodes. The output is obtained by connecting a load between the base electrode of the transistor and the junction of the diodes. The emitter-to-base junction of the transistor is thus forward biased by the application of a signal of one polarity to the emitter and the base-to-collector junction is forward biased by the application of a signal of the other polarity through one of the diodes and the load to the base. The emitter-to-base path of a second transistor is employed as the load circuit whereby the output current flow of the rectifier circuit in response to an input pulse of either polarity results in unidirection voltage pulses on the collector of the load transistor.

The foregoing and other objects and features of this invention will be fully understood from the following description of an illustrative embodiment thereof taken in conjunction with the accompanying drawing.

Referring now to the drawing, input terminal 1 has applied thereto alternate positive and negative pulses. These pulses are passed through capacitor 2 to the base of transistor 5. The collector of transistor 5 is connected through resistor 4 to negative battery and the emitter is connected through resistor 6 to positive battery. The output from transistor 5 is taken from the emitter whereby the transistor acts as an emitter follower. Accordingly, the potential on the emitter of transistor 5 follows the potential applied to the base whereby the emitter goes positive in response to a positive pulse and goes negative in response to a negative pulse.

The emitter of transistor 5 is connected to the junction of diode 8 and the emitter of p-n-p transistor 7. Transistor 7, whose collector is connected to ground, has its base electrode connected to the base of n-p-n transistor 11. The collector of transistor 11 is connected through resistor 12 to positive battery. The emitter of transistor 11 is connected through diode 10 to the junction of diode 8 and diode 9. Diode 9, in turn, is connected to ground.

When the emitter of transistor 5 goes positive, a positive potential with respect to ground is applied in series across the emitter to base junction of transistor 7, the base-to-emitter junction of transistor 11 and diodes 10 and 9. This forward biases transistors 7 and 11 and diodes 10 and 9. When the positive potential exceeds the threshold of diodes 10 and 9, the diodes conduct. This permits current to flow through the collector-to-emitter path of transistor 11, causing the collector output potential to be approximately ground.

When the emitter of transistor 5 goes negative, a negative potential with respect to ground is applied in series across diodes 8 and 10, the emitter-to-base junction of transistor 11 and the base-to-collector junction of transistor 7. The characteristics of a p-n-p transistor are such that if the base of the transistor is made more negative than the collector, the transistor will operate with the collector acting as an emitter. Thus, p-n-p transistor 7 together with diodes 8 and 10 and transistor 11 is forward biased.

When the negative potential exceeds the threshold of diodes 8 and 10, the diodes conduct. This permits current to flow through the collector-to-emitter junction of transistor 11 causing the collector potential to be approximately ground. Accordingly, transistor 11 is rendered conductive when the pulses exceed a predetermined threshold, whereby the circuit functions as a signal rectifier.

The alternate positive and negative pulses provided at the emitter of transistor 5 have a short rise and fall time during the pulse transitions. Therefore, during the pulse transition the input potential to the signal rectifier does not exceed the threshold and transistor 11 stops conducting. Thus, the collector of transistor 11 is held near ground potential with the exception that a positive potential is momentarily applied thereto via resistor 12 for a short interval corresponding to the pulse transition.

When no signals are applied through input terminal 1 and capacitor 2 to the base of transistor 5, a ground potential is applied to the base thereof through resistor 3. This maintains the emitter of transistor 5 at approximately a ground potential. With ground on the emitter of transistor 5 and on diode 8, transistor 11 cannot conduct. Accordingly, a positive potential is applied to the collector of transistor 11 by way of resistor 12 in the absence of input pulses.

Although a specific embodiment of this invention has been shown and described, it will be understood that various modifications may be made without departing from the spirit of this invention and within the scope of the appended claims.

What is claimed is:

1. A full wave signal rectifier circuit comprising a transistor including a base, emitter and collector, a first and second impedance connected in series across the emitter-to-collector path of said transistor, a source of input signals connected across the emitter-to-collector path of said transistor, and a load circuit interconnecting the base of said transistor and the junction of said first and second impedance.

2. A full wave signal rectifier circuit comprising a transistor including a base, emitter and collector, a pair of reversely poled diodes connected in series across the emitter-to-collector path of said transistor, a source of input signals connected across the emitter-to-collector path of said transistor, and a load circuit interconnecting the base of said transistor and the junction of said diodes.

3. A full wave signal rectifier circuit comprising a first transistor including a base, emitter and collector, a first and second impedance connected in series across the emitter-to-collector path of said first transistor, a source of input signals connected across the emitter-to-collector path of said first transistor and a second transistor including a base and an emitter, the base-to-emitter path of said second transistor interconnecting the base of said first transistor and the junction of said first and second impedance.

4. A full wave signal rectifier circuit comprising a first transistor including a base, emitter and collector, a pair of reversely poled diodes connected in series across the emitter-to-collector path of said first transistor, a source of input signals connected across the emitter-to-collector path of said first transistor, and a second transistor including a base and an emitter, the base-to-emitter path of said second transistor interconnecting the base of said first transistor and the junction of said diodes.

5. A full wave signal rectifier circuit comprising a first transistor including a base, emitter and collector, a source of input signals connected across the emitter-to-collector path of said first transistor, a pair of reversely poled diodes connected in series across said emitter-to-collector path, and a second transistor including a base and an emitter, said second transistor base being connected to said first transistor base and said second transistor emitter being connected to the junction of said diodes.

6. A full wave signal rectifier circuit comprising a first transistor including a base, emitter and collector, a source of input signals connected to the emitter of said transistor, a source of fixed potential connected to the collector of said transistor, a first and second impedance connected in series between said emitter and said fixed potential source, and a second transistor including a base and an emitter, said second transistor base being connected to said first transistor base and said second transistor emitter being connected to the junction of said first and second impedance.

7. A full wave signal rectifier circuit comprising a first transistor including a base, emitter and collector, a source of input signals connected to the emitter of said transistor, a source of fixed potential connected to the collector of said transistor, a pair of reversely poled diodes connected in series between said emitter and said fixed potential source, and a second transistor including a base and an emitter, said second transistor base being connected to said first transistor base and said second transistor emitter being connected to the junction of said diodes.

No references cited.

ARTHUR GAUSS, *Primary Examiner.*

J. BUSCH, *Assistant Examiner.*